(12) United States Patent
Serkiz et al.

(10) Patent No.: US 9,220,942 B1
(45) Date of Patent: Dec. 29, 2015

(54) LOAD AND LAG GOLF GLOVE

(71) Applicant: W.A.T. SPORTS, LLC, Bend, OR (US)

(72) Inventors: Steven M. Serkiz, Aiken, SC (US);
Matthew D. Folsom, Aiken, SC (US);
John P. Perkins, Bend, OR (US);
Nicholas F. DeRoller, Aiken, SC (US)

(73) Assignee: W.A.T. SPORTS, LLC, Bend, OR (US)

( * ) Notice: Subject to any disclaimer, the term of this patent is extended or adjusted under 35 U.S.C. 154(b) by 0 days.

(21) Appl. No.: 14/832,274

(22) Filed: Aug. 21, 2015

Related U.S. Application Data

(60) Provisional application No. 62/039,950, filed on Aug. 21, 2014.

(51) Int. Cl.
| A63B 69/36 | (2006.01) |
| A41D 19/00 | (2006.01) |
| A63B 24/00 | (2006.01) |
| A63B 71/06 | (2006.01) |

(52) U.S. Cl.
CPC ........ *A63B 24/0006* (2013.01); *A41D 19/0027* (2013.01); *A41D 19/0031* (2013.01); *A63B 69/36* (2013.01); *A63B 71/0619* (2013.01); *A63B 2071/0655* (2013.01); *A63B 2208/0204* (2013.01); *A63B 2230/62* (2013.01)

(58) Field of Classification Search
USPC ......... 473/207, 212, 213, 219, 227, 266, 267, 473/276, 409; 2/161.2
See application file for complete search history.

(56) References Cited

U.S. PATENT DOCUMENTS

| 5,062,855 | A | | 11/1991 | Rincoe | |
|---|---|---|---|---|---|
| 5,324,038 | A | | 6/1994 | Sasser | |
| 5,509,809 | A | * | 4/1996 | Clay | A63B 69/3608 434/252 |
| 5,583,478 | A | | 12/1996 | Renzi | |
| 5,771,492 | A | * | 6/1998 | Cozza | A63B 69/3608 2/161.2 |
| 5,876,292 | A | * | 3/1999 | Hamilton | A63B 69/3608 273/DIG. 30 |
| 6,401,254 | B1 | * | 6/2002 | Boller | A41D 19/0027 116/223 |
| 6,800,035 | B1 | * | 10/2004 | Couch | A63B 69/3608 473/213 |
| 6,885,361 | B1 | | 4/2005 | Harvill et al. | |
| 7,033,281 | B2 | | 4/2006 | Carnahan et al. | |
| 7,780,541 | B2 | | 8/2010 | Bauer | |
| 7,834,909 | B2 | | 11/2010 | Katano et al. | |
| 8,029,414 | B2 | | 10/2011 | Ingvast et al. | |
| 8,165,844 | B2 | | 4/2012 | Luinge et al. | |
| 2005/0178213 | A1 | | 8/2005 | Skowronski | |
| 2006/0256036 | A1 | | 11/2006 | Katano et al. | |
| 2010/0144455 | A1 | | 6/2010 | Ahern | |
| 2010/0144456 | A1 | | 6/2010 | Ahern | |
| 2011/0224009 | A1 | | 9/2011 | Shan | |
| 2011/0292049 | A1 | | 12/2011 | Muravsky | |
| 2011/0302694 | A1 | | 12/2011 | Wang et al. | |
| 2012/0025945 | A1 | | 2/2012 | Yazadi et al. | |

* cited by examiner

*Primary Examiner* — Nini Legesse
(74) *Attorney, Agent, or Firm* — J. Bennett Mullinax, LLC

(57) ABSTRACT

A magnetometer and magnet are incorporated into a glove in order to measure the magnetic field between the two carrying an athletic movement such as a golf swing. The resulting magnetic field can be related to the distance between the magnet and the magnetometer in the wrist-joint angle, allowing a real time receptacle signal to be transmitted to the user when a proper wrist angel in achieved.

10 Claims, 9 Drawing Sheets

LOAD AND LAG GOLF GLOVE

RELATED APPLICATIONS

This application claims the benefit of U.S. Application Ser. No. 62/039,950 filed on Aug. 21, 2014 and which is incorporated herein by reference.

FIELD OF THE INVENTION

This invention relates to a golf training glove with sensors for triggering a perceptible signal, either audio or vibrational, when a user-set proper or improper wrist angle is obtained during a golf swing. According to the invention, a magnetometer and magnet sensor set(s) is incorporated into a glove in order to measure the magnetic field from the sensor set during a golf swing in real time. Because the magnetic field can be easily related to the distance between the magnet and magnetometer and the wrist-joint angle, a real-time perceptible signal can be transmitted to the golfer when the proper or improper wrist angle is achieved.

BACKGROUND OF THE INVENTION

This invention relates generally to golf swing training aids. There are a variety of golf aids that are designed to improve or correct a golfer's club swing. Such aids have included modified training clubs, harnesses worn by a golfer to reinforce a proper swing motion, modified club grips, and various apparatuses that confine the golf club swing arc to a predetermined path. While there are multiple examples of inventions for both gloves used for joint-angle measurements and golf-training devices embedded in gloves, the system described in this application is unique within the prior art.

For example, US20110224009, incorporated herein by reference, teaches the use of a training device to mechanically fix and/or constrain the wrist during a golf swing. A mechanical constraint approach, however, is limited in teaching joint movement as muscle memory is not developed by user induced motion.

U.S. Pat. No. 7,033,281 (B2), incorporated herein by reference, teaches the use of flex sensors to measure joint angle. Because the flexible sensors bend during the measurement, this sensor is inferior to the magnetometer as the sensor because it is subject to degradation in performance (i.e., reduced range of electrical conductivity with use) over time. Furthermore, the invention does not teach the quantification of joint angle as a function sensor response.

While a great number of techniques and apparatuses exist to improve a golfer's swing, there remains room for improvement and variation within the art.

SUMMARY OF THE INVENTION

It is one aspect of at least one of the present embodiments to provide a method and apparatus for transmitting real-time information to a golfer regarding a proper/improper wrist angle during a club swing. In order to induce increased club-head speed during the swinging of a golf club it is necessary to decrease the wrist-hinge angle made between the thumb and radius bone (so-called loading of the club shaft) during the down swing as a means of storing angular momentum (commonly referred to as club-head lag). To monitor when wrist-hinge angle is reduced during loading process and provide the perceptible feedback to the golfer, a magnet and magnetometer set is placed at the base of the thumb and at a location on the glove corresponding to the edge of the radius bone closest to the thumb. During application and prior to the swinging of the club, the user sets the magnetic field strength corresponding to desired wrist-hinge angle by manually moving (i.e., cocking) the wrist to the desired angle and then this magnetic-field value is stored by the device either by pressing a set point button on the glove or by a gesture movement (e.g., a rapid downward motion read by an accelerometer). During the golf swing, the magnetic field strength is measured in real time and compared with the magnetic field strength set point value. If and when the set point value is attained or exceeded, a perceptible signal (e.g., audio and/or vibrational) is transmitted. The signal is transmitted for a short time period (e.g., 0.25 sec) and then is muted for a period (e.g., 1 sec) so as to not signal during the reduction in wrist hinge angle associated with the follow through of the golf swing.

It is another aspect of at least one embodiment of this invention to provide a method and apparatus that monitors wrist flexion and provides feedback to a golfer regarding wrist flexion information. During a golf swing, angular momentum is stored during the golf swing as wrist flexion and, conversely is lost when wrist extension occurs prior to impact of the golf club head with the golf ball. Anatomically the flexion/extension angle is created by the back of the hand and wrist by the carpal and ulna/radius bones. In this case, the training glove can be used to monitor the wrist flexion with a magnet and magnetometer set placed on glove at the base of the back of the hand and at a location on the glove corresponding to the edge of the ulna/radius bones closest to the back of the hand. If the flexion angle increases (i.e., increased joint extension) beyond the user set angle (e.g., 180° for a flat wrist) as measured by an increase in the measured magnetic field during the downswing prior to impact of the golf club with golf ball, a condition often referred to as wrist breakdown, a perceptible signal is transmitted for a short time period. During application, the user sets the magnetic field strength corresponding to desired wrist-flexion angle by manually moving (i.e., cocking) the wrist to the desired angle and then this magnetic-field value is stored by the device either by pressing a set point button on the glove or by a gesture movement (e.g., a rapid downward motion read by an accelerometer). During the golf swing, the magnetic field strength is measured in real time and compared with the set point value. If and when the set point value is attained or exceeded, a perceptible signal (e.g., audio and/or vibrational) is transmitted.

It is another aspect of at least one embodiment of this invention to provide a method and apparatus for measuring a change in the wrist-hinge angle between the back of the hand and a wrist comprising; a glove adapted for placement on a hand, the glove having at least one wrist edge portion adapted for placement along a wearers wrist; a magnet carried by the wrist edge portion of the glove; the magnetometer carried by the glove and in a location in proximity to a base of a thumb portion of the glove; a battery carried by the glove and in further communication with a microcontroller carried by the glove, the microcontroller in operative communication with the magnetometer and at least one of either a speaker or a vibration unit; wherein, when the magnetometer in proximity to the magnet indicates a change in the wrist angle exceeding a preset value, at least one of either a speaker or a vibration unit is actuated to alert the user of the change in wrist angle.

It is another aspect of at least one embodiment of this invention to provide a method and apparatus for detecting the change in a wrist-hinge angle between the back of a hand and the wrist comprising the steps of providing a glove adapted for placement on a hand, the glove having at least one wrist edge portion adapted for placement along a wearers wrist; a magnet carried by the wrist edge portion of the glove at a location on the glove corresponding to the edge of the ulna/radius bones closest to the back of the hand; the magnetometer carried by the glove and in a location in proximity to a base of a wrist portion of the glove; a battery carried by the glove and in further communication with a microcontroller carried by the glove, the microcontroller in operative communication with the magnetometer and at least one of either a speaker or a vibration unit; placing the glove on a users hand wherein the magnetometer is located in proximity to a base of the wrist portion of the glove and the magnet is positioned along a wrist edge portion of the glove; having the user make an athletic movement involving a change in the position of the individual's wrist in relationship to the individual's hand; detecting a change in a wrist angle using the magnet and magnetometer; and, signaling the user when, the change in the wrist angle exceeds a threshold value.

BRIEF DESCRIPTION OF THE DRAWINGS

A fully enabling disclosure of the present invention, including the best mode thereof to one of ordinary skill in the art, is set forth more particularly in the remainder of the specification, including reference to the accompanying drawings.

FIGS. 3A and 3B represent the special case of a 1D magnetometer and all positions are representative of a 3D magnetometer.

DESCRIPTION OF THE PREFERRED EMBODIMENT

Reference will now be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention cover such modifications and variations as come within the scope of the appended claims and their equivalents. Other objects, features, and aspects of the present invention are disclosed in the following detailed description. It is to be understood by one of ordinary skill in the art that the present discussion is a description of exemplary embodiments only and is not intended as limiting the broader aspects of the present invention, which broader aspects are embodied in the exemplary constructions.

In describing the various figures herein, the same reference numbers are used throughout to describe the same material, apparatus, or process pathway. To avoid redundancy, detailed descriptions of much of the apparatus once described in relation to a figure is not repeated in the descriptions of subsequent figures, although such apparatus or process is labeled with the same reference numbers.

Figure 1A:
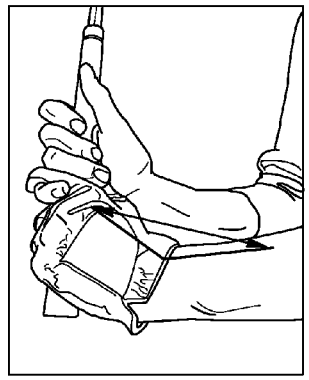
FIG. 1A illustrates the wrist-hinge angle and FIG. 1B illustrates the wrist flexion-extension angle (note: flexion is an increase and extension is a decrease in the angle) (R) for a right-handed golfer.
Figure 1B:
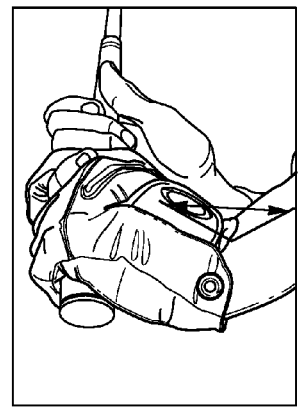
Figure 2A:
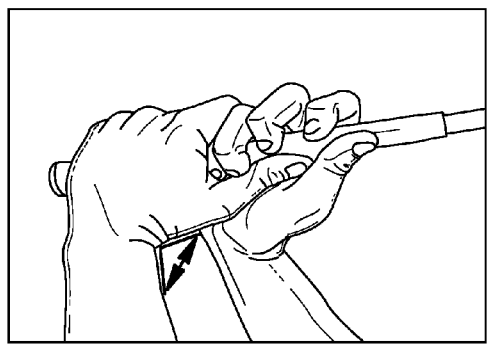
FIGS. 2A & 2B illustrates the sequence of the decrease of wrist-hinge angle during loading of club shaft for a right-handed golfer.
Figure 2B:
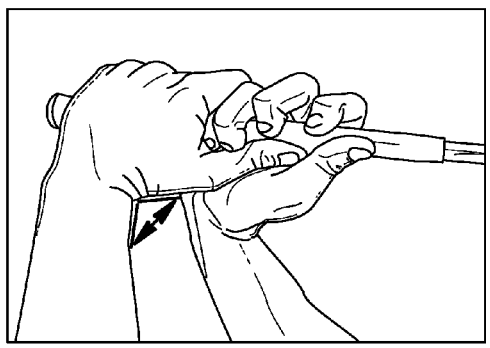

The invention is based on the concept of measuring the angle of wrist hinge and wrist flexion/extension as seen in FIG. 1 through the real-time measurement of magnetic field using a simple magnetometer-magnet sensor incorporated into a golf glove and to provide a perceptible signal when the user-defined angle set point is obtained. The perceptible signal is a method to allow the user to learn to (1) reduce the wrist-hinge angle and consequently load the club shaft (FIG. 2) and (2) prevent wrist extension that results in wrist breakdown during the swinging of a golf club. The loading of the club shaft acts to promote club-head lag and conservation of stored angular momentum that leads to increased club-head speed and the associated ball flight distance. While preventing wrist breakdown also promotes stored angular momentum, it also promotes straighter ball flight and more solid ball-club face contact.

Figure 3A:
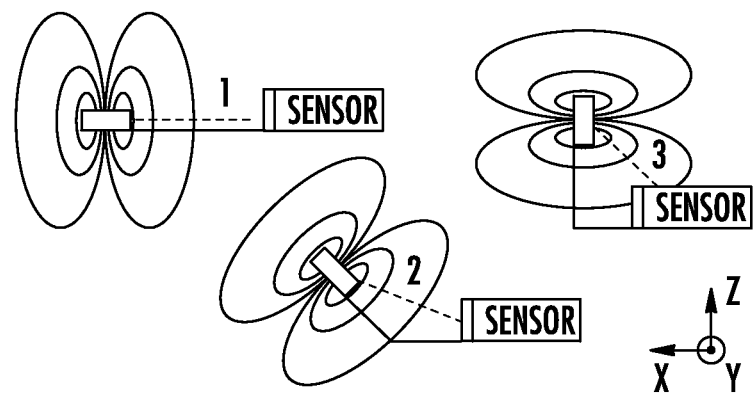
FIGS. 3A & 3B illustrates the magnetic field and magnetometer geometry for sensing application with FIG. 3A magnet hinged toward the sensor and FIG. 3B shows the magnet slid or "pinched" toward the sensor. Position 1 in both
Figure 3B:
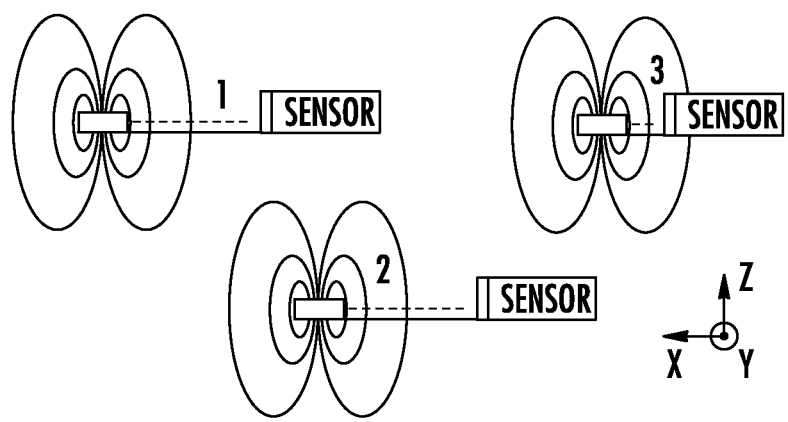

A commercially available magnetometer-magnet sensor is used to directly relate the wrist-hinge and wrist flexion/extension angle to the electrical potential of the magnetometer (i.e., magnetic field) and, therefore, can be used to provide feedback to the golfer as a perceptible signal in real-time (on the order of hundreds of data points per second) during a golf swing. FIG. 3 illustrates the magnetic field and magnetometer geometry for this sensing application.

A magnetometer is a sensor used to measure the strength and/or direction of the magnetic field. These sensors have been widely incorporated into modern smart phones and are commercially available and inexpensive. For example, the linear Hall-effect sensor is commonly used in smart phones as a means of reading compass headings from the magnetic field of the earth. This sensor can be easily adapted to accurately measure the strength of a magnetic field associated generated by permanent magnet or an electromagnet.

Within the population of commercially available magnetometers, both linear (i.e., single axis or 1D) and multiple axis (e.g., three axis or 3D) exist. Both magnetometer types can be used with the subject invention, although each may exhibit advantages in specific applications (e.g., linear in reduced costs and multi-axis for measurements where movement is in greater than one plane). Examples of the application of both types of magnetometers are given below.

Knowing the geometry of the magnetometer, magnet, and pivot point, the angle between the magnetometer and magnet can be easily calibrated to the electrical potential or magnetic field strength of the magnetometer as depicted in FIG. 3.

Figure 4A:
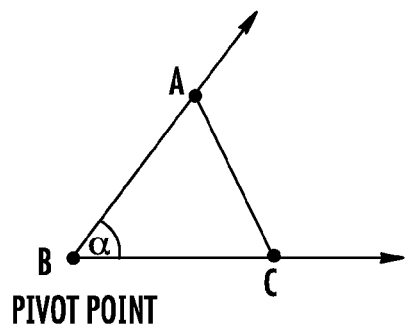
FIGS. 4A-4C set forth electrical potential data as a function of distance and angle for a 1D Honeywell SS49E magnetometer and a ½" in diameter by 1/16" thick N35 grade neodymium both at a distance of ¼" from the pivot point.
Figure 4B:
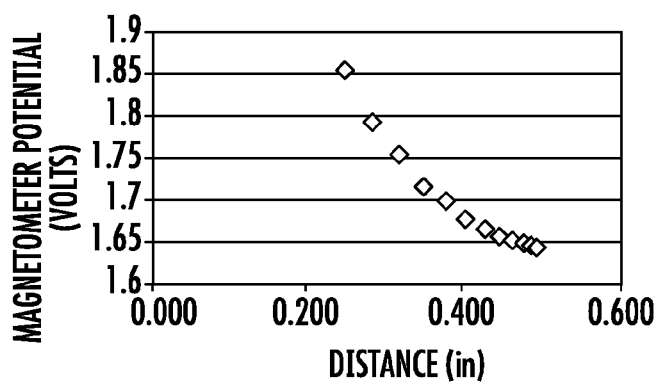
Figure 4C:
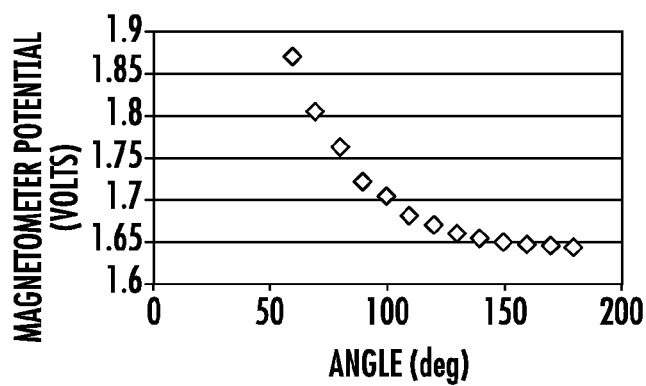

In an example of a linear (i.e., 1D magnetometer), electrical potential data as a function of distance and angle (a) for a Honeywell SS49E Linear Hall-effect magnetometer and a ½" in diameter by 1/16" thick N35 grade neodymium magnet (c. 1.2 Tesla (T) residual magnetic flux density) are presented in FIG. 4. These data were collected with the magnetometer placed at point A and the center of the disk of the magnet placed at point C with both points A and C being located at a distance of 0.25" from point B. The angle was systematically varied from in 10° increments from 180° to 60° and the distance between the magnetometer and magnet (line segment AC in FIG. 4) as well as the magnetometer response in volts recorded. These data are plotted in the graphs in FIGS. 4B and 4C and show that the sensor response, measured in terms of electrical potential, decreases systematically with increasing distance (FIG. 4B) and increasing angle (FIG. 4C). Therefore, this sensor system can be easily calibrated to measure both distance to a distance of about ½ inch and, knowing the geometry, the angle.

While other systems could be envisioned for this application (e.g., flex sensors and conductive fibers), the magnetic sensor system described herein responds without mechanical bending or having contacting parts and, therefore, is not susceptible to degradation of the sensor response associated with mechanical wear.

Figure 5:
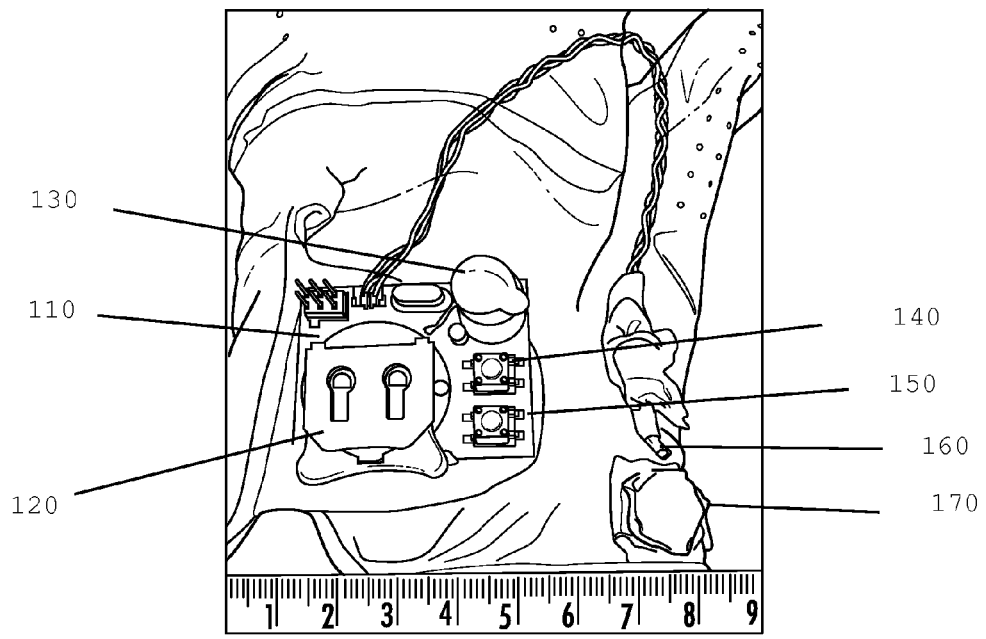
FIG. 5 is a layout of a 1D sensor system on glove with the scale shown in centimeters.

In one preferred refinement of the invention, the sensor system (magnetometer 170 and magnet 160) is incorporated into a golf glove with the magnet 170 being attached to the wrist of the glove, the magnetometer being attached to the glove at the base of the thumb, and the microcontroller 110, battery 120, speaker 130 and other electronics being located on a small circuit board affixed to the back (i.e., opposite of the palm) of the glove (see FIG. 5). In this embodiment of this invention as a golf training aid: a right-handed golfer would place the glove on the left hand (although the wrist-hinge angle could also be monitored on the right wrist with a right-handed glove); the power is turned on via the power button 150 on the circuit board (see FIG. 5); the golfer would then set the target wrist-hinge angle by cocking the wrist and pressing the wrist-angle set button 140 on the circuit board 110 (see FIG. 5); the golfer would then make a golf swing and a short audible beep would be transmitted from the speaker 130 if and when the desired reduction in wrist angle is obtained.

In still another embodiment of this sensor system for a golf training aid, the magnetometer/magnet 170/160 can be placed on the back of glove to measure the change in the flexion angle between the back of the hand and the flat of the wrist (i.e., joint on the back of the hand created by the carpal and ulna/radius bones). The sensors arrangement would be used monitor the reduction in the wrist flexion angle, often referred to as wrist breakdown, prior to impact of the club with the golf ball. As with the previously described embodiment of this invention, a short audible beep would be transmitted from the speaker if the user-set undesired reduction in wrist angle is obtained during the swing prior to impact.

Figure 6:
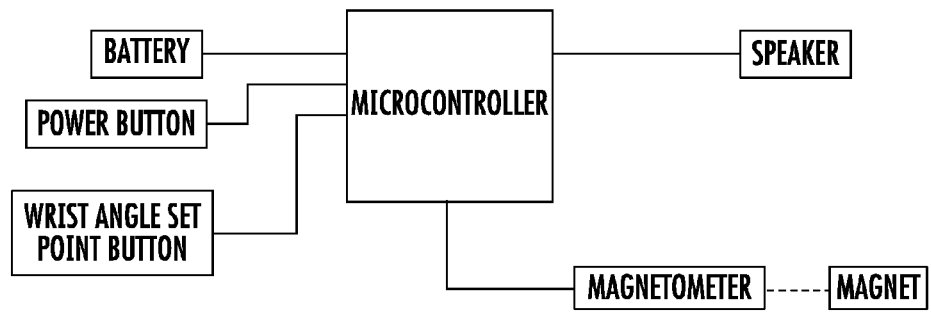
FIG. 6 is an electrical schematic for the electronic components of one embodiment of a golf training glove.

A block diagram of the circuit board and magnet for one embodiment of this invention are presented as FIG. 6. With this system, a microcontroller (e.g., an Atmega328) measures the electrical potential of the magnetometer (e.g., Honeywell SS49E Linear Hall-effect magnetometer) at a rate greater than 200 data points per second. The battery is a 20 mm lithium 3V coin cell to, save space and provide a long operational lifetime. Because the electrical potential of the magnetometer can be directly related to the wrist-hinge angle, the potential of the magnetometer is then compared by the microcontroller to the wrist hinge-angle set point. The electrical potential of the magnetometer is stored into the set point when the user presses the set point button. After setting the desired wrist angle, if the electrical potential measured by the magnetometer is higher than the set point, the speaker is activated for a minimum of one quarter second (note: the duration of the speaker activation can easily be changed in within the microcontroller). After being powered on, the system is programmed to power off after 600 seconds of inactivity to conserve battery life.

Figure 7:
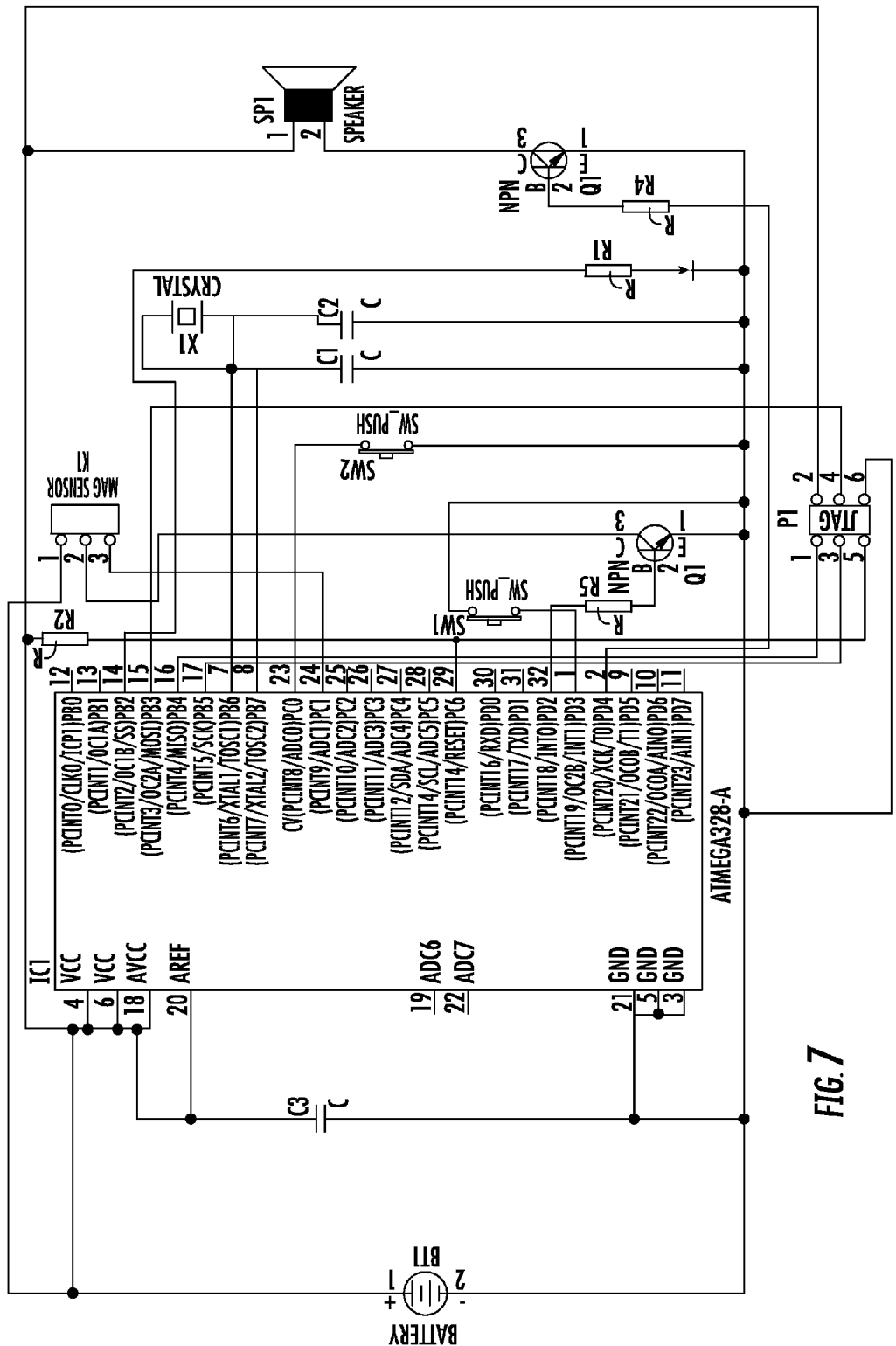
FIG. 7 is an electrical schematic for the electronic components of the 1D magnetometer embodiment of a golf training glove.

In one preferred embodiment, the system is designed around an electronic microcontroller, more specifically an IC1 Atmega328 microcontroller. The electrical schematic for this embodiment is presented as FIG. 7. The microcontroller is powered by the battery in parallel with a capacitor for power conditioning. The microcontroller is programmed though P1. SW1 and SW2 in FIG. 7 are the power and wrist angle set point buttons, respectively. In FIG. 7, the crystal X1 and capacitors C1 and C2 are optional and are used for higher clock speed utilization of the microcontroller. D1 in FIG. 7 is the indicator LED for indication of the power state of the microcontroller and communication to the user of a successful setting of the wrist angle. The metal oxide field-effect transistor (MOSFET) designated as Q2 controls the speaker SP1. K1 is the magnetometer used for measuring the magnetic field that is directly relatable to the distance and angle between the magnet and magnetometer. Q1 in the electrical schematic is used to restrict current flow to the magnetometer K1 in order to conserve power when the sensor is not in use.

A second example of magnetic sensing is a multiple axis sensing method using a three-dimensional (3D) sensor (Melexis MLX90393), which has three Hall-effect sensors oriented in the x, y, and z spatial directions. In more complex geometries where the movement and subsequent angle change are not in a single plane, a 1D magnetometer will not have an accurate response for movements that contain an out-of-plane component. If, however, the vector magnitude is calculated from of all three axes, accurate distances and angles for movements that are not in a single plane can be obtained. In this example, all three axes are polled from the Melexis 3D magnetometer and the vector magnitude (M=sqrt $(x^2+y^2+z^2)$) calculated within the microprocessor, in this case an STM32L0 type ARM microcontroller.

Figure 8:
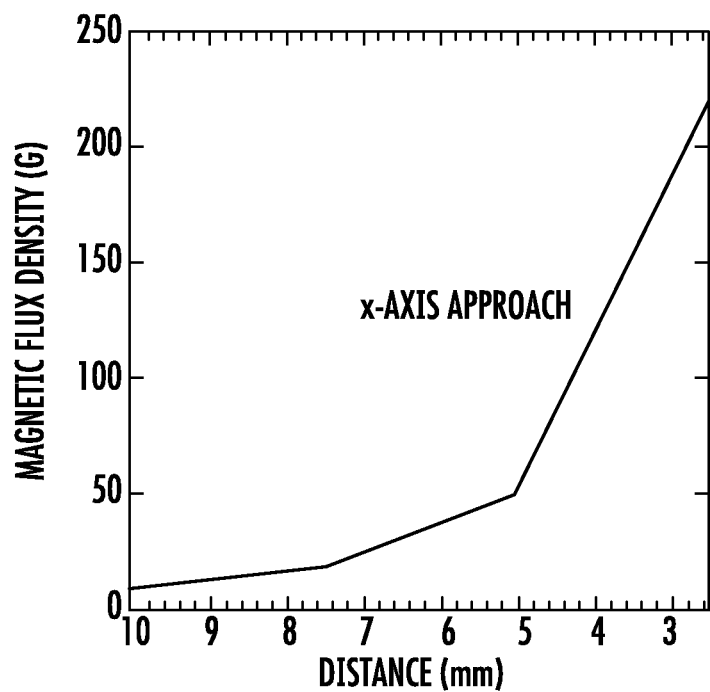
FIG. 8 are vector magnitude data and plot for the x axis approach for the 3D magnetometer.

As a simple example of the 3D magnetometer system, the magnetometer was approached by a rare earth magnet (N42 type—100 mils diameter by 40 mils thickness) along a single axis. This magnet has residual flux density (i.e., strength of the magnet) approximately 1.3 T. When the 3D magnetometer is observed from a single axis the other two axes will have a measurable response due to the curved nature of the magnetic field. For this example values, output from the digital sensor in binary format (converted to micro-Teslas), as well as the microprocessor calculated magnitude, for the x, y, and z magnetometers were recorded as a function of distance from the sensor as the magnet approached the magnetometer from the x-direction (see FIG. 8 and Table 1).

By measuring magnetic fields with a 3D magnetometer and using a a vector analysis of the data, the measured vector field strength depends not only on the residual flux density (i.e., strength of the magnet), but also on the geometry of the magnetic field. Therefore, the selection of the magnet can be used to manipulate the effective working range of the magnet-magnetometer sensing unit.

Figure 11:
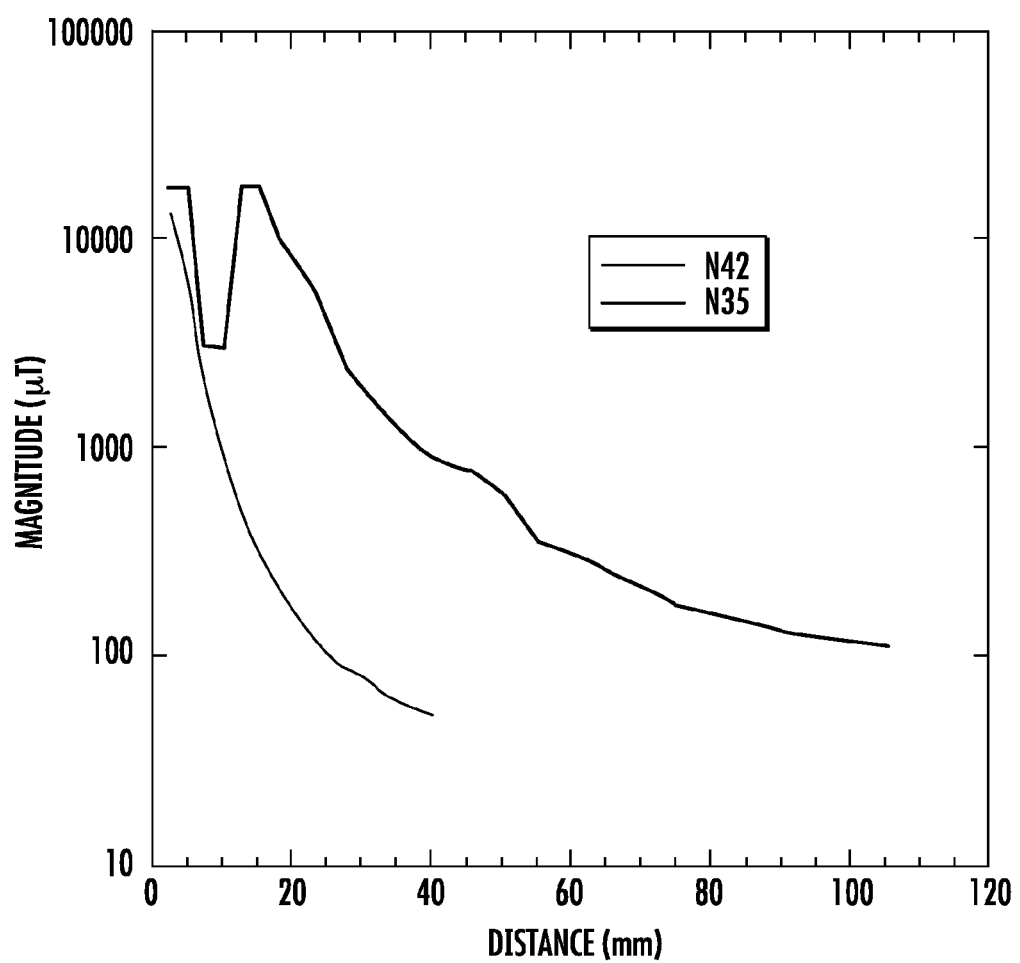
FIG. 11 is a graph using data from Tables 3 and 4 setting forth spacing distances between N42—1 mm thick, 2.5 mm diameter and N35—3 mm thick, 12 mm diameter) and a 3D Melexis MLX90393 sensor.

As an example two commercially available magnets with a similar residual flux density of approximately 1.3T (N42—1 mm thick, 2.5 mm diameter and N35—3 mm thick, 12 mm diameter) were placed a known distance from a 3D Melexis MLX90393 sensor and the magnetic flux recorded. These data are presented in Tables 3 and 4 for the NA42 and NA35 magnets, respectively and graphically in FIG. 11.

To be an effective working range (i.e., sensing distance between the magnet and magnetometer), the magnet-magnetometer must (1) exhibit a systematic decrease in measured magnetic flux with increasing distance and (2) have a magnetic flux above the background of the earth's magnetic field. According to NOAA, the earth's magnetic field at the test location is expected to have a flux density of 49 µT. Based on these criteria, the geometrically smaller NA42 magnet with the 3D Melexis MLX90393 sensor exhibits a working range from 2.5 mm to 40 mm. For the larger NA35 magnet with the 3D Melexis MLX90393 sensor, at distances smaller than 15 mm the measured magnetic flux does not exhibit a systematic decrease with increasing distance. This is due to a portion of the magnetic not being captured by the magnetometer at close range. Therefore, the working distance for the NA42 magnet with the 3D Melexis MLX90393 sensor is about 15 to 37.5 mm.

These data clearly show that the effective working range can be tailored to the desired application based on the strength, geometry, and size of the magnet. Similarly, the selection of the magnetometer with regard to the size, geometry, and sensitivity of the sensing, element can also be used to manipulate the working range depending on the desired application.

TABLE 1

| Distance (mm) | X (µT) | Y (µT) | Z (µT) | Vector Magnitude (µT) |
| --- | --- | --- | --- | --- |
| 2.5 | 19154 | −950 | 11107 | 22162 |
| 5 | 4589 | −70 | 1742 | 4908 |
| 7.5 | 1761 | −88 | 405 | 1809 |
| 10 | 838 | −42 | 177 | 857 |

Figure 9A:
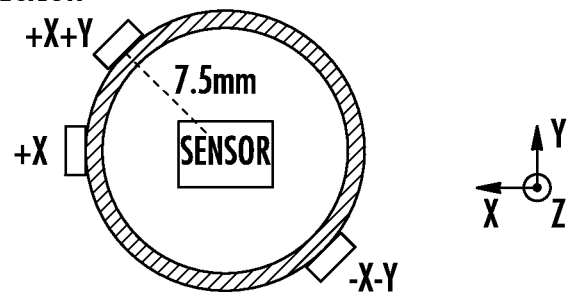
FIGS. 9A and 9B are diagrams showing dome used to maintain a 7.5 mm radius distance from the bottom-center of the magnetometer and data collected for this 3D magnetometer. An example of positions are given as +Zm is Z-minor, where the magnet is placed at the lowest Z-angle allowable by the test structure. All other uses of Z are at a 45° elevation except for where Z is used alone. Where X and Y are measured together, the magnet is positioned 45° off from the respective direction.
Figure 9B:
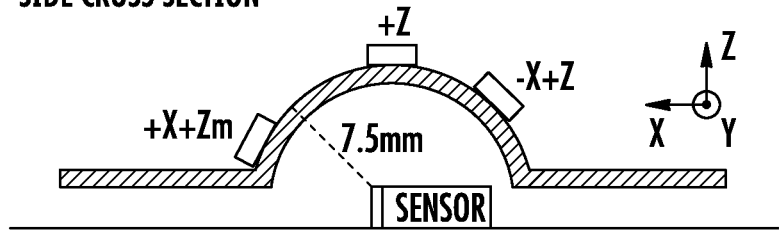

As a second evaluation of the vector analysis of the 3D magnetometer, the magnet was placed at a constant distance of 7.5 mm between the surface of the magnet and the center of the sensor at five locations not along the x, y, or z axes using the dome structure shown in FIG. 9 and Table 2. Between five different positions over the dome which involved all three axes, an average of 1972 µT was observed across the values with a standard deviation of 74 µT. These data show that the angle of approach does not influence the measurement of magnetic flux using this system and analysis approach.

TABLE 2

| Relative position | Vector Magnitude (µT) | |
| --- | --- | --- |
| +Y + Zm | 2041 | |
| −X − Y + Zm | 1906 | |
| +X − Y + Z | 1904 | |
| +Z | 2062 | |
| +Y + Z | 1949 | |
| | 1972 | mean |
| | 74.8 | σ |

TABLE 3

| Distance (mm) | N42 (µT) |
| --- | --- |
| 2.5 | 13360 |
| 5 | 6383 |
| 7.5 | 2031 |
| 10 | 994 |
| 12.5 | 536 |
| 15 | 340 |
| 17.5 | 230 |
| 20 | 171 |
| 22.5 | 133 |
| 25 | 108 |
| 27.5 | 91 |
| 30 | 83 |
| 32.5 | 72 |
| 35 | 66 |
| 37.5 | 60 |
| 40 | 56 |

TABLE 4

| Distance (mm) | N35 (µT) |
| --- | --- |
| 5 | 17912 |
| 10 | 3106 |
| 15 | 18045 |
| 20 | 8096 |
| 25 | 4188 |
| 30 | 1940 |
| 35 | 1296 |
| 40 | 916 |
| 45 | 823 |
| 50 | 616 |
| 55 | 364 |
| 60 | 318 |
| 65 | 263 |
| 70 | 226 |
| 75 | 183 |
| 80 | 166 |
| 85 | 152 |
| 90 | 138 |
| 95 | 131 |
| 100 | 122 |
| 105 | 117 |
| 290 | 64 |

Figure 10:
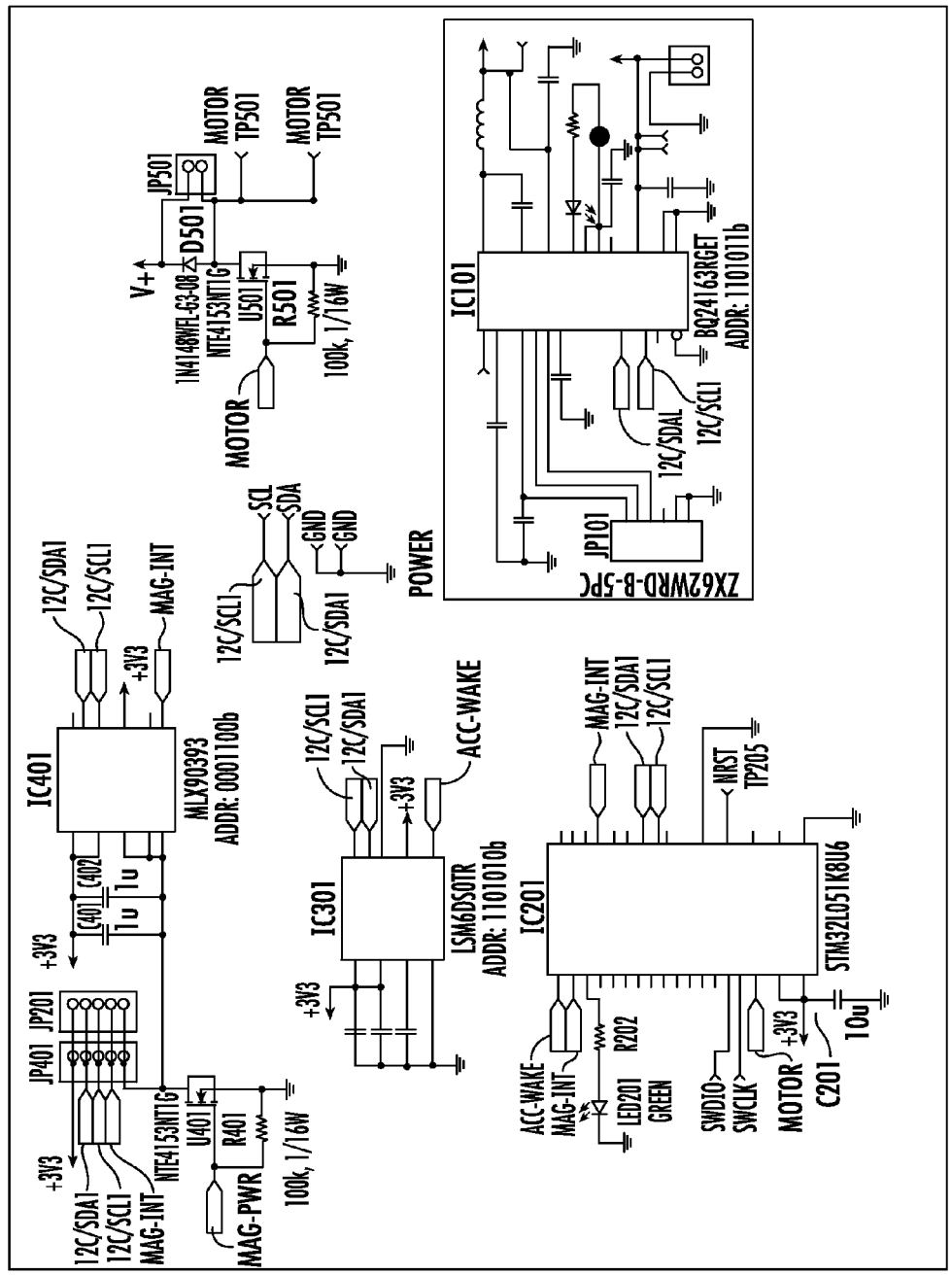
FIG. 10 is a circuit diagram for implementation of the 3D magnetometer embodiment.

A diagram of the second invention embodiment is in FIG. 10. Instead of a speaker, this implementation uses a vibrating motor for discrete user feedback. The device is powered via a small LiPo battery, and charging is monitored and controlled by a Texas Instruments gas-gauge processor (BQ24163) which allows use of commonly found USB micro chargers used to charge cell phones. Instead of buttons, the device is controlled via gestures monitored by an STMico (LSM6DS0) accelerometer/gyroscope. In this case the magnetic field set point would be recorded by manually moving the wrist into the desired position and then executing a specific gesture (e.g., a quick downward motion) that would be determined from a specific response from the accelerometer. This device is capable of monitoring conditions in a low power state so that it may wake the device up when certain conditions are met. By using gestures and detection of positioning, the device is capable of automated adjustments based on conditions and better power management. For instance, the device is able to detect when a swing is starting or ending for the sake of user feedback, calibration, and power management. This also opens up the device for future capabilities such as motion tracking.

While other systems could be envisioned for this application (e.g., flex sensors and conductive fibers), the magnetic sensor system described herein responds without mechanical bending or having contacting parts and, therefore, is not susceptible to degradation of the sensor response associated with mechanical wear.

While the application of a system for the dynamic measurement of a joint angle has been described for wrist-hinge and wrist flexion/extension angle monitoring during a golf swing, the invention has application for dynamically measuring and providing feedback for other joint angles during: a golf swing (e.g., pronation leading hand palm rotated up; supination, leading hand palm rotated down), other sport activities (e.g., hitting or pitching a baseball, serving a tennis ball), as well as medical rehabilitation.

While exemplary uses are described in terms of confirming a wrist flex angle being established during an athletic move such as a golf swing, it is also recognized that the present apparatus and process of using the apparatus can be provided for other sports in which there may be desire to confirm that a change in the wrist angle does not occur. For instance, in certain tennis strokes, it is important that the basic stroke technique being taught emphasizes that one does not pivot the wrist during forearm or back arm motions. The present glove has an ability to be set or cocked with an angle of 180° (ambient wrist) and signal the user if the 180° is not sufficiently maintained during a stroke. In this manner, the glove can provide feedback to the user that a proper stroke techniques which minimizes a wrist angle flexing, is maintained.

In another refinement of the invention, a variety of Personal Interface Controllers have means for wirelessly transmitting data; in particular the measured values logged to and processed from the magnetometer sensor system. Wireless data transmission allows the measured values to be logged and processed further using a personal computer or smart phone and permits the change in angles to be subsequently visualized on the display unit.

It is envisioned that a personal computer or smart phone could also be used to set desired angles for the glove as well record and display the resulting performance data. The ability to provide a suitable software interface for a computer or an application on a smart phone is well within the skill level of one having ordinary skill in the art.

Although preferred embodiments of the invention have been described using specific terms, devices, and methods, such description is for illustrative purposes only. The words used are words of description rather than of limitation. It is to be understood that changes and variations may be made by those of ordinary skill in the art without departing from the spirit or the scope of the present invention which is set forth in the following claims. In addition, it should be understood that aspects of the various embodiments may be interchanged, both in whole, or in part. Therefore, the spirit and scope of the appended claims should not be limited to the description of the preferred versions contained therein.

That which is claimed:

1. An apparatus for measuring a change in the wrist-hinge angle between the back of the hand and a wrist comprising;
    a glove adapted for placement on a hand, the glove having at least one wrist edge portion adapted for placement along a wearers wrist;
    a magnet carried by the wrist edge portion of the glove;
    a magnetometer carried by the glove and in a location in proximity to a wrist edge portion of the glove;
    a battery carried by the glove and in further communication with a microcontroller carried by the glove, the microcontroller in operative communication with the magnetometer and at least one of either a speaker or a vibration unit;
    wherein, when the magnetometer in the glove indicates a change in the wrist angle exceeding a preset value, at least one of either a speaker or a vibration unit is actuated to alert the user of the change in wrist angle.

2. The apparatus according to claim 1 wherein the magnetometer and the magnet are spaced apart at a distance from about 3.2 mm to about 13 mm.

3. The apparatus according to claim 1 wherein the magnetometer is a three-dimensional magnetometer that detects movement in three planes.

4. The apparatus according to claim 3 wherein the three-dimensional detecting magnetometer is spaced from about 2.5 millimeters to about 40.0 millimeters from the magnet.

5. The apparatus according to claim 3 wherein the distance between the three-dimensional detecting magnetometer is at a distance from the magnet from at least about 15 millimeters.

6. The apparatus according to claim 3 wherein the three-dimensional detecting magnetometer is between about 15 to about 38 millimeters from the magnet.

7. A process of detecting the change in a wrist-hinge angle between the back of a hand and the wrist comprising the steps of:
    providing a glove adapted for placement on a hand, the glove having at least one wrist edge portion adapted for placement along a wearers wrist;
    a magnet carried by the wrist edge portion of the glove;
    a magnetometer carried by the glove and in a location in proximity to a wrist edge portion of the glove;
    a battery carried by the glove and in further communication with a microcontroller carried by the glove, the microcontroller in operative communication with the magnetometer and at least one of either a speaker or a vibration unit;
    placing the glove on a users hand wherein the magnetometer is located in proximity to a base of a thumb portion of the glove and the magnet is positioned along a wrist edge portion of the glove;
    having the user make an athletic movement involving a change in the position of the individual's wrist in relationship to the individual's hand;
    detecting a change in a wrist angle using the magnet and magnetometer; and,
    signaling the user when the change in the wrist angle exceeds a threshold value.

8. The process according to claim 7 prior to the step that making an athletic movement the additional step of setting the wrist angle by movement of the wrist occurs.

9. The process according to claim 7 wherein said step of detecting the change in a wrist angle using the magnet and magnetometer additionally includes using a 3-dimensional sensor that will detect movement in x, y, and z directions.

10. The process according to claim 7 wherein said step of detecting a change in a wrist angle using the magnet and magnetometer further includes detecting a wrist angle movement that occurs within a single plane relative to the magnet and the magnetometer.

* * * * *